United States Patent
Strache et al.

(10) Patent No.: US 12,464,643 B2
(45) Date of Patent: Nov. 4, 2025

(54) POWER MODULE WITH A CERAMIC CIRCUIT CARRIER, A FLEXIBLE CIRCUIT BOARD AND A TEMPERATURE SENSOR

(71) Applicant: Robert Bosch GmbH, Stuttgart (DE)

(72) Inventors: Sebastian Strache, Wannweil (DE); Christoph Friederich, Reutlingen (DE); Dominik Alexander Ruoff, St. Johann (DE); Frank Zander, Rottenburg am Neckar (DE); Tatiana Barsukova, Riederich (DE); Tobias Zahn, Rottenburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 258 days.

(21) Appl. No.: 18/549,063

(22) PCT Filed: Mar. 3, 2022

(86) PCT No.: PCT/EP2022/055358
§ 371 (c)(1),
(2) Date: Sep. 5, 2023

(87) PCT Pub. No.: WO2022/189241
PCT Pub. Date: Sep. 15, 2022

(65) Prior Publication Data
US 2024/0164014 A1 May 16, 2024

(30) Foreign Application Priority Data
Mar. 8, 2021 (DE) ...................... 10 2021 202 197.2

(51) Int. Cl.
*H05K 1/11* (2006.01)
*H05K 1/03* (2006.01)

(52) U.S. Cl.
CPC ........... *H05K 1/0306* (2013.01); *H05K 1/118* (2013.01); *H05K 2201/10151* (2013.01)

(58) Field of Classification Search
CPC ................. H05K 1/0306; H05K 1/118; H05K 2201/10151
(Continued)

(56) References Cited

U.S. PATENT DOCUMENTS

| 2018/0114735 A1 | 4/2018 | Nakamura et al. |
| 2019/0013275 A1* | 1/2019 | Sunshine ............ H01L 23/3121 |
| 2023/0308026 A1* | 9/2023 | Byers .................... H02M 7/003 |

FOREIGN PATENT DOCUMENTS

| CN | 104282679 A | 1/2015 |
| DE | 102017118490 A1 | 2/2019 |
| EP | 1662568 A2 | 5/2006 |

OTHER PUBLICATIONS

International Search Report for PCT/EP2022/055358, Issued Jul. 20, 2022.

* cited by examiner

*Primary Examiner* — Binh B Tran
(74) *Attorney, Agent, or Firm* — NORTON ROSE FULBRIGHT US LLP

(57) ABSTRACT

A power module, in particular a commutation cell for an inverter. The power module includes a circuit carrier, in particular a ceramic circuit carrier, and at least one or only one semiconductor switch half-bridge with two semiconductor switches, in particular power semiconductor switches, wherein the semiconductor switches are in particular integrally connected to the circuit carrier. The power module of the above-mentioned type includes a flexible circuit board, which is in particular integrally connected to the circuit carrier. The flexible circuit board is arranged in the area of the semiconductor switches. The power module (Continued)

comprises a temperature sensor, which is integrally connected to the flexible circuit board and is designed and arranged to sense a temperature of the circuit carrier in the area of the semiconductor switches, and in particular thus indirectly a temperature of the semiconductor switches, through the flexible circuit board.

11 Claims, 1 Drawing Sheet

(58) Field of Classification Search
USPC .......................................................... 361/764
See application file for complete search history.

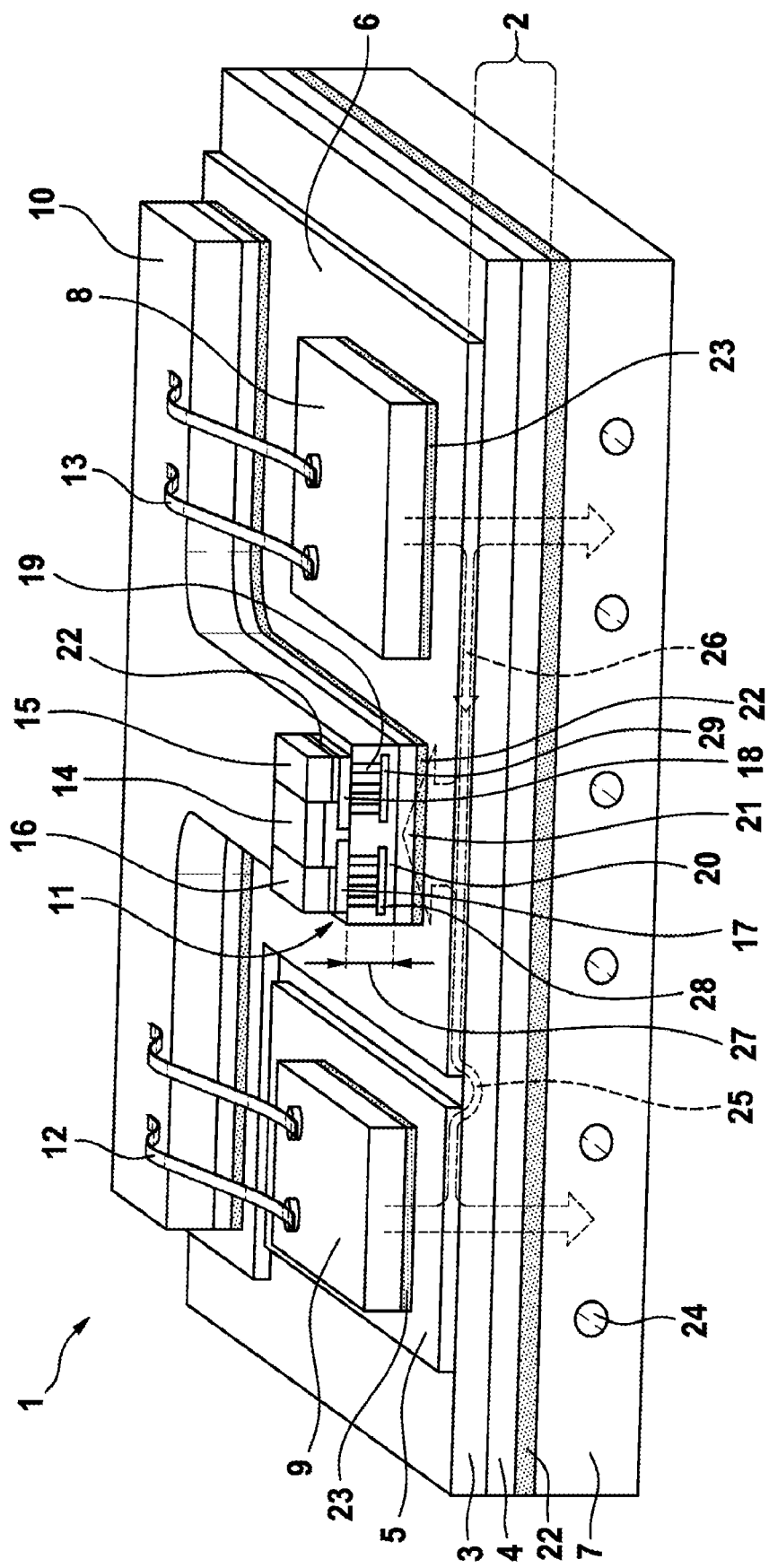

POWER MODULE WITH A CERAMIC CIRCUIT CARRIER, A FLEXIBLE CIRCUIT BOARD AND A TEMPERATURE SENSOR

FIELD

The present invention relates to a power module, in particular to a commutation cell for an inverter. The power module includes a circuit carrier, in particular a ceramic circuit carrier, and at least one or only one semiconductor switch half-bridge with two semiconductor switches, in particular power semiconductor switches, wherein the semiconductor switches are in particular integrally connected to the circuit carrier.

SUMMARY

According to the present invention, the power module of the above-mentioned type includes a preferably flexible circuit board, in particular an FCB (FCB=flexible circuit board), which is in particular different from the circuit carrier and is in particular integrally connected to the circuit carrier. The flexible circuit board is arranged in the area of the semiconductor switches. According to an example embodiment of the present invention, the power module includes a temperature sensor, which is integrally connected to the flexible circuit board and is designed and arranged to sense a temperature of the circuit carrier in the area of the semiconductor switches, and in particular thus indirectly a temperature of the semiconductor switches, through the flexible circuit board.

Advantageously, a temperature of the semiconductor switches can thus be indirectly sensed in an economical manner by means of the temperature sensor. The temperature sensor is preferably soldered to the flexible circuit board, in particular reflow-soldered. The flexible circuit board can thus advantageously serve as a fastening means for fastening the temperature sensor to the circuit carrier. The heat loss generated by the semiconductor switches can thus be conducted along a flat extension of the circuit carrier, i.e., laterally, to a location of the circuit carrier on which the temperature sensor is arranged. The temperature sensor and the location of the circuit carrier enclose the flexible circuit board between one another.

In a preferred embodiment of the present invention, the flexible circuit board is designed to supply the semiconductor switches with a control signal for switching the semiconductor switches. Advantageously, by means of the flexible circuit board, a control signal can thus be fed to the semiconductor switches, and a temperature signal generated by the temperature sensor and representing a temperature of the semiconductor switches can be conducted away, and further preferably be fed to a processing unit, in particular a driver for the semiconductor switch half-bridge.

In a preferred embodiment of the present invention, the power module comprises at least one bond connection, in particular a bond strip or a bond wire, which is guided from the flexible circuit board to the semiconductor switches for controlling the semiconductor switches. Advantageously, an electrical connection can thus be formed from the flexible circuit board to the semiconductor switches.

In a preferred embodiment of the present invention, the temperature sensor is soldered, in particular reflow-soldered, to the flexible circuit board. Advantageously, the temperature sensor can thus be soldered together with other electronic components, for example resistors, capacitors or a driver for the semiconductor switches.

In another embodiment of the present invention, the temperature sensor may be glued to the flexible circuit board. The adhesive bonding, in particular an adhesive connecting the temperature sensor to the flexible circuit board, can be an electrically conductive adhesive, for example.

In another embodiment of the present invention, the temperature sensor may be sintered to the flexible circuit board by means of a sintering material. For example, the sintering material may be a sintering paste, in particular a silver sintering paste.

In a preferred embodiment of the present invention, the flexible circuit board comprises at least one thermally conductive via connection in the area of the temperature sensor. The via connection is formed in the circuit board at least along a portion of the thick extension thereof. Advantageously, the heat loss generated by the semiconductor switches of the semiconductor switch half-bridge can thus be conducted in the circuit carrier, in particular in an electrically conductive layer of the circuit carrier, up to the via connection and can there be conducted through the flexible circuit board in the area of the via connection, and can thus reach the temperature sensor.

The via connection is formed, for example, by a thermally conductive metal bridge, which is in particular galvanically generated.

In a preferred embodiment of the present invention, the temperature sensor is a resistance sensor. The resistance sensor is preferably designed to sense a temperature and to change its ohmic resistance as a function of the sensed temperature, and to thus generate a temperature-dependent temperature signal. Advantageously, the temperature sensor can thus be provided in an economical manner. For example, the temperature sensor is an NTC sensor (NTC=negative temperature coefficient). Advantageously, the temperature sensor can thus have a greater electrical conductivity, and thus a smaller electrical resistance, as the temperature increases, so that current flowing through the temperature sensor at a predetermined threshold value can represent a temperature threshold that is not to be exceeded, and an error signal can be generated if it is exceeded.

In a preferred embodiment of the present invention, the circuit carrier is a ceramic circuit carrier. The ceramic circuit carrier preferably comprises an electrically insulating ceramic layer, in particular an aluminum oxide layer or silicon nitride, and at least one electrically conductive layer, in particular a rewiring layer, preferably a copper layer, connected to the ceramic layer, in particular eutectically. For example, the circuit carrier is an AMB circuit carrier (AMB=active-metal-brazed), a DCB circuit carrier (DCB=direct-copper-bonded), or an IMS substrate (IMS=insulated-metal-substrate).

Advantageously, the circuit carrier can thus have good thermal conductivity and high current-carrying capacity for the semiconductor switches. The semiconductor switches are preferably sintered, or soldered, to the circuit carrier.

In a preferred embodiment of the present invention, the circuit carrier comprises an electrically conductive layer, in particular a conductor path, which is integrally connected to the flexible circuit board, in particular by means of a soldering material, sintering material or an electrically conductive adhesive. The electrically conductive layer is guided up to the semiconductor switches so that a heat transfer resistance formed from the semiconductor switches up to the temperature sensor is less than a heat transfer resistance formed in the ceramic layer parallel thereto. Preferably, the electrically conductive layer extends between the temperature sensor and the ceramic layer. The temperature sensor and ceramic layer thus enclose the electrically conductive layer of the circuit carrier and the flexible circuit board between one another.

Advantageously, the heat loss generated by the semiconductor switches can thus flow via the conductor path up to the temperature sensor at a low heat transfer resistance. The ceramic layer can thus form a heat transfer resistance toward a heat sink, which is thermally conductively connected to the circuit carrier.

In a preferred embodiment of the present invention, the power module comprises a heat sink, which is thermally conductively connected to the circuit carrier. The circuit carrier is preferably thermally conductively connected, with a side facing away from the semiconductor switches, to the heat sink. The circuit carrier preferably comprises an electrically conductive layer, in particular a rear layer, which is integrally connected, preferably soldered, to the heat sink. Advantageously, the heat loss generated by the semiconductor switches can thus be conducted toward the heat sink. The heat loss generated by the semiconductor switches can be conducted in part at a low heat transfer resistance along the electrically conductive layer up to the temperature sensor and can there reach the temperature sensor through the flexible circuit board.

The electrically conductive rewiring layer of the ceramic circuit carrier preferably has a greater length-related thermal conductivity coefficient than the electrically insulating ceramic layer of the circuit carrier. Advantageously, the heat loss can thus be conducted on the surface of the circuit carrier up to the temperature sensor. A temperature difference can thus be formed between the rewiring layer and a heat sink thermally conductively connected to the circuit carrier.

According to an example embodiment of the present invention, the flexible circuit board preferably comprises at least one electrically insulating layer, in particular a polyimide layer, nylon layer, polyester layer, elastomer layer or mylar layer, and at least one electrically conductive layer, in particular a copper layer. Preferably, the flexible circuit board comprises at least one electrically insulating layer, which is formed between a rewiring layer connected to the electrical terminals of the temperature sensor and an electrically conductive layer designed for soldering to the circuit carrier. The electrically insulating layer, which thus forms an intermediate layer, which extends between the temperature sensor and the circuit carrier, can thus be designed as an electrical insulating layer, which can have sufficient dielectric strength against electrical voltages conducted in the circuit carrier.

Preferably, according to an example embodiment of the present invention, the flexible circuit board is designed to be flexible or resilient in such a way that the circuit board can be bent perpendicularly or in a U-shape without breaking. Preferably, the flexible circuit board is designed to be free of reinforcing fibers. Advantageously, the flexible circuit board can thus be designed to be elastic in such a way that the flexible circuit board can follow thermal expansions of the circuit carrier in the integral connection with the circuit carrier.

Preferably, according to an example embodiment of the present invention, the electrically insulating layer of the flexible circuit board is designed to be thinner than the electrically insulating layer of the ceramic circuit carrier.

The electrically insulating layer of the circuit carrier preferably has a thickness of between 0.2 and 1 millimeter, further preferably of between 0.3 and 0.5 millimeters. Preferably, the electrically insulating layer of the flexible circuit board has a thickness of between 10 micrometers and 100 micrometers, further preferably of between 20 micrometers and 30 micrometers. The flexible circuit board preferably has a thickness of between 100 micrometers and 500 micrometers. Preferably, a thickness ratio between the flexible circuit board and the circuit carrier is 1:5 to 1:10.

The present invention also relates to a method for sensing a temperature of a power semiconductor switch. According to an example embodiment of the present invention, in the method, a heat loss generated by the power semiconductor switch is introduced into a ceramic circuit carrier integrally connected to the power semiconductor switch. In the circuit carrier, the introduced heat loss is conducted away from the power semiconductor switch, in particular transversely, in an electrically conductive layer, in particular a rewiring layer, connected to a ceramic layer of the circuit carrier in the area of the power semiconductor switch. The heat loss is further conducted in the electrically conductive layer to a circuit board, in particular a flexible circuit board, integrally connected to the electrically conductive layer. The heat loss is further conducted through the flexible circuit board along a thickness extension of the flexible circuit board up to a temperature sensor soldered to the flexible circuit board. Advantageously, the flexible circuit board can thus form an electrical insulator toward the electrically conductive layer. Preferably, the electrically conductive layer is a copper layer or an aluminum layer.

The present invention also relates to an inverter, in particular for an electric vehicle or a hybrid vehicle. According to an example embodiment of the present invention, for each phase, the inverter comprises at least one power module of the above-described type and is designed to power an electric machine for generating a magnetic rotating field. Advantageously, a temperature of the power electronics of the inverter can thus be monitored in an economical and reliable manner. The inverter is preferably designed to generate an error signal or to limit a current generated by the inverter, as a function of a temperature signal generated by the temperature sensor.

The present invention is explained in more detail below with reference to the figures and further exemplary embodiments. Further advantageous design variants result from a combination of the features disclosed herein.

BRIEF DESCRIPTION OF THE DRAWINGS

FIG. 1 shows a power module according to an example embodiment of the present invention.

DETAILED DESCRIPTION OF EXAMPLE EMBODIMENTS

FIG. 1 shows an exemplary embodiment of a power module comprising a ceramic circuit carrier and a flexible circuit board, which are soldered together, wherein a temperature sensor is soldered onto the flexible circuit board and is designed and arranged to sense a temperature of at least one power semiconductor connected to the circuit carrier.

FIG. 1 shows an exemplary embodiment of a power module 1. The power module 1 comprises a circuit carrier 2. The circuit carrier 2 comprises an electrically insulating ceramic layer 3, in particular an aluminum oxide layer. The circuit carrier 2 also comprises a thermally conductive and electrically conductive rear contact 4, in particular a copper layer. The circuit carrier 2 is thermally conductively and integrally connected, with the rear contact 4, to a heat sink 7 by means of a soldering material 22.

The circuit carrier 2 also comprises at least one conductor path 5, which is arranged on the ceramic layer 3 and is in particular eutectically connected to the ceramic layer 3, and a conductor path 6, which is galvanically isolated from the conductor path 5 in this exemplary embodiment. In this exemplary embodiment, the conductor paths 5 and 6 are designed as an electrically conductive layer, in particular a copper layer, in particular a thick copper layer.

For example, the circuit carrier 2 is an AMB substrate, a DCB substrate, or an IMS substrate.

In this exemplary embodiment, the power module 1 also comprises at least one power semiconductor switch, which is integrally connected, in particular soldered or sintered by means of a sintering material, to the circuit carrier 2, in particular the conductor path.

The power module 1 comprises a power semiconductor switch 8 and a power semiconductor switch 9, which are each sintered to the electrically conductive layer 6 and the electrically conductive layer 5, respectively, by means of a sintering material 23.

In this exemplary embodiment, the power semiconductor switches 8 and 9 together form a semiconductor switch half-bridge. The semiconductor switch half-bridge comprises a low-side semiconductor switch and a high-side semiconductor switch. In this respect, the power semiconductor switch 9 forms the low-side semiconductor switch and the power semiconductor switch 8 forms the high-side semiconductor switch.

The power module 1 also comprises a flexible circuit board 10. The flexible circuit board 10 comprises at least one electrically insulating layer 20, in particular a polyimide layer or polyamide layer or mylar layer. The flexible circuit board 10 also comprises at least one electrically conductive layer, which is connected to the electrically insulating layer, in particular by means of lamination. The flexible circuit board 10 in this exemplary embodiment comprises an electrically conductive rear layer 21, which is soldered to the electrically conductive layer 6 of the circuit carrier 2 by means of a soldering material 22 or by means of a thermally conductive adhesive. The flexible circuit board 10 also comprises at least two further electrically conductive layers 17 and 18, which are arranged on the side of the flexible circuit board 10 that is opposite to the rear layer 21 and are connected to the electrically insulating layer 20, in particular by means of lamination. The electrically conductive layers 17 and 18 are each connected, in particular soldered, to a temperature sensor 14, which is a component of the power module 1.

In this exemplary embodiment, the temperature sensor 14 is arranged on a connecting axis extending between the power semiconductor switches 8 and 9, so that the temperature sensor 14 can receive heat loss generated by the power semiconductor switches 8 and 9.

The flexible circuit board 10 in this exemplary embodiment is designed to feed control signals to the power semiconductor switches 8 and 9. For this purpose, the power semiconductor switches 8 and 9 are each electrically connected to the flexible circuit board 10 by means of at least one bond wire. A bond wire 12 connecting the flexible circuit board 10 to the power semiconductor switch 9 and a bond wire 13 connecting the flexible circuit board 10 to the power semiconductor switch 8 are denoted by way of example.

In this exemplary embodiment, the flexible circuit board 10 extends adjacently to the power semiconductor switches 8 and 9, in particular flanking them. The flexible circuit board 10 and the power semiconductor switches 8 and 9 extend in this exemplary embodiment in the same plane of the circuit carrier 2. In this exemplary embodiment, the power semiconductor switches 8 and 9 are spaced apart from one another and enclose a blade 11 which originates from the flexible circuit board 10 and is molded onto the flexible circuit board 10. In this exemplary embodiment, the temperature sensor 14 is arranged on the blade 11 of the flexible circuit board 10. In this exemplary embodiment, both the blade 11 and the temperature sensor 14 are arranged on the connecting axis extending between the power semiconductor switches 8 and 9.

In the area of the temperature sensor 14, the flexible circuit board 10 comprises at least one thermally conductive via connection, hereinafter also referred to as a via, which extends between the temperature sensor 14 and the electrically conductive layer 21 along a height extension of the electrically insulating layer 20 up to a further electrically conductive layer 28 and 29, respectively. In this way, the electrically insulating layer 20 can be interspersed, for better thermal conduction, by the thermally conductive vias, which are each formed, for example, by a metal cylinder, in particular a copper cylinder, wherein the electrically conductive layers 28 and 29 have a thermally conductive and/or heat-spreading function.

The electrically insulating layer 20 comprises a layer portion extending between the vias 19 and the electrically conductive rear layer 21, so that the rear layer 21 is electrically insulated from the vias 19 and is thus galvanically isolated. The vias intersperse the electrically insulating layer 20 on a portion along the thickness extension 27 thereof. For example, the electrically insulating layer has a layer thickness of between 25 micrometers and 100 micrometers. For example, the electrically conductive layers each have a layer thickness of between 15 and 30 micrometers. The electrically insulating layer 20 may be formed from several superposed, electrically insulating individual layers.

The vias 19 are each connected to one of the electrically conductive layers 17 or 18, which in this exemplary embodiment are each soldered by means of a soldering material 22, or are glued by means of an electrically conductive adhesive, to a terminal 15 and 16, respectively, of the temperature sensor 14.

The temperature sensor 14 is thus sufficiently connected to the electrically conductive layer 6 of the circuit carrier 2 by means of the thermally conductive vias 19 so that a heat loss coming from the power semiconductor switch 8, in particular, a partial heat loss stream 26, can be conducted via the electrically conductive layer 6 of the circuit carrier 2 up to the blade 11 of the flexible circuit board 10 and there, passing through the soldering material layer 22, the electrically conductive rear layer 21 and the electrically insulating polyimide layer 20, and further the via connections 19, can reach the electrical connecting contacts of the flexible circuit board 10, which are each formed by the electrically conductive layers 17 and 18.

The heat loss, which is generated by the power semiconductor switch 9, may in part, in particular in the form of a partial heat loss stream 25, flow via the electrically conductive layer of the circuit carrier 2 and further, bridging a gap between the electrically conductive layer 5 and the electrically conductive layer 6, via the electrically insulating ceramic layer 3 to the electrically conductive layer 6 in order to from there reach, like the partial heat loss stream 26, the temperature sensor 14 via the flexible circuit board 10.

In this exemplary embodiment, the heat sink 7 comprises fluid channels, of which one fluid channel 24 is denoted by way of example. The heat sink 7 can thus have a temperature different from the electrically conductive layer and/or from the electrically conductive layer 5. The temperature sensor 14, which is arranged in proximity to the power semiconductor switches 8 and 9, can thus sufficiently accurately sense a temperature of the power semiconductor switches 8 and 9.

In this exemplary embodiment, the temperature sensor 14 is formed by a temperature-dependent resistor, in particular an NTC resistor.

Unlike as shown in FIG. 1, the power module 1 may in another embodiment comprise an electrically conductive layer on which the power semiconductor switches 8 and 9 are arranged together. The electrically conductive layers 5 and 6 thus form a common, continuously connected, electrically conductive layer. For example, the power semiconductor switches 8 and 9 may thus be controlled in parallel to one another and in a manner electrically synchronously operating together.

The partial heat loss stream 25 then no longer flows, as shown in FIG. 1, bridging the gap in part in the electrically insulating ceramic layer 3, but flows like the partial heat loss stream 26 continuously in the electrically conductive layer, which is designed to be continuous in this embodiment.

The invention claimed is:

1. A power module including a commutation cell for an inverter, the power module comprising:
   a ceramic circuit carrier;
   at least one semiconductor switch half-bridge with two semiconductor switches connected to the circuit carrier;
   a flexible circuit board integrally connected to the circuit carrier, wherein the flexible circuit board is arranged in an area of the semiconductor switches; and
   a temperature sensor integrally connected to the flexible circuit board and configured and arranged to sense a temperature of the circuit carrier in the area of the semiconductor switches through the flexible circuit board.

2. The power module according to claim 1, wherein the flexible circuit board is configured to supply the semiconductor switches with a control signal for switching the semiconductor switches.

3. The power module according to claim 1, wherein the temperature sensor is soldered to the flexible circuit board.

4. The power module according to claim 1, wherein the flexible circuit board includes, in an area of the temperature sensor, at least one thermally conductive via connection, which is formed in the flexible circuit board at least along a portion of a thickness extension of the flexible circuit board.

5. The power module according to claim 1, wherein the temperature sensor is a resistance sensor.

6. The power module according to claim 5, wherein the temperature sensor is soldered to the flexible circuit board.

7. The power module according to claim 1, wherein the ceramic circuit carrier includes an electrically insulating ceramic layer and at least one electrically conductive layer connected to the ceramic layer.

8. The power module according to claim 1, wherein the electrically conductive layer is a rewiring layer.

9. The power module according to claim 1, wherein the circuit carrier includes an electrically conductive layer, which is integrally connected to the flexible circuit board, and the electrically conductive layer is guided up to the semiconductor switches so that a heat transfer resistance formed from the semiconductor switches up to the temperature sensor is less than a heat transfer resistance formed in the ceramic layer parallel thereto.

10. The power module according to claim 1, further comprising:
    a heat sink thermally conductively connected to the circuit carrier.

11. A method for sensing a temperature of a power semiconductor switch, the method comprising:
    introducing a heat loss generated by the power semiconductor switch into a ceramic circuit carrier integrally connected to the power semiconductor switch; and
    conducting the introduced heat loss away from the power semiconductor switch transversely, in an electrically conductive layer connected to a ceramic layer of the circuit carrier in an area of the power semiconductor switch, and the heat loss is conducted in the electrically conductive layer to a flexible circuit board integrally connected to the electrically conductive layer, and is conducted through the flexible circuit board along a thickness extension of the flexible circuit board up to a temperature sensor soldered to the flexible circuit board.

\* \* \* \* \*